DS 
United States Patent

Nakabeppu

Patent Number: 6,103,587
Date of Patent: Aug. 15, 2000

[54] METHOD FOR FORMING A STACKED STRUCTURE CAPACITOR IN A SEMICONDUCTOR DEVICE

[75] Inventor: Kenichi Nakabeppu, Tokyo, Japan

[73] Assignee: NEC Corporation, Tokyo, Japan

[21] Appl. No.: 08/807,950

[22] Filed: Feb. 28, 1997

[30] Foreign Application Priority Data

Feb. 28, 1996 [JP] Japan ................................. 8-41162

[51] Int. Cl.[7] ........................ H01L 21/8242; H01L 21/20
[52] U.S. Cl. .......................... 438/398; 438/253; 438/255; 438/396; 438/964; 257/306; 257/309
[58] Field of Search .................................... 438/255, 398, 438/964, 253, 254, 396, 397; 257/306, 307, 308, 309

[56] References Cited

U.S. PATENT DOCUMENTS

| 5,182,232 | 1/1993 | Chhabra et al. | 438/398 |
|---|---|---|---|
| 5,223,081 | 6/1993 | Doan | 438/398 |
| 5,387,531 | 2/1995 | Rha et al. | 438/398 |
| 5,658,381 | 8/1997 | Thakur et al. | 438/398 |
| 5,696,014 | 12/1997 | Figura | 438/398 |
| 5,863,826 | 1/1999 | Wu et al. | 438/423 |

FOREIGN PATENT DOCUMENTS 5-291523  11/1993  Japan.

OTHER PUBLICATIONS

Takeuchi et al., "Shallow Implantation By Gas Source ICB Technique", *Technical Report of IEICE*, pp. 97–104, (1994).
HSIEH et al., "Molecular–Dynamics Simulations Of Collisions Between Energetic Clusters Of Atoms And Metal Substrates", *Physical Review B*, vol. 45(8):4417–4430, (1992).

*Primary Examiner*—Carl Whitehead, Jr.
*Assistant Examiner*—Toniae M. Thomas
*Attorney, Agent, or Firm*—Foley & Lardner

[57] ABSTRACT

In a method for forming in a semiconductor device a stacked structure capacitor having a lower capacitor plate and an upper capacitor plate sandwiching a dielectric film therebetween, after a first conducting film, which becomes the lower capacitor plate, is formed, ionized clusters are implanted or impacted to a surface of the first conducting film. Thereafter, cluster-implanted regions are selectively removed from the surface of the first conducting film to resultantly roughen the surface of the first conducting film. Then, a dielectric film is formed on the roughened surface of the first conducting film, and a second conducting film, which becomes the upper capacitor plate, is formed on the dielectric film.

25 Claims, 8 Drawing Sheets

METHOD FOR FORMING A STACKED STRUCTURE CAPACITOR IN A SEMICONDUCTOR DEVICE

BACKGROUND OF THE INVENTION

1. Field of the Invention

The present invention relates to a semiconductor device manufacturing method, and more specifically to a method for forming a stacked structure capacitor in a semiconductor device.

2. Description of Related Art

In semiconductor memories, particularly in a DRAM (dynamic random access memory), the most important problem is to increase an integration density or the number of elements per chip. In the DRAM memory, the simplest memory cell consists of one transfer transistor and one capacitor (one transistor type memory cell), and is widely used since it is the most suitable for increasing the integration density.

However, increase of the integration density results in reduction of the memory cell size, so that the capacitance of the capacitor is correspondingly inevitably reduced. Reduction of the capacitance leads to a drop of S/N ratio (signal to noise ratio), which often causes malfunction of the DRAM. Namely, this has become a large problem in an advanced micro-fabrication.

Under this circumstance, one method has been proposed, which has attempted to increase the capacitance of the capacitor under the same occupying area, by causing the capacitor plate surface to have convexities and concavities so as to increase an effective surface area of the capacitor plate.

As one process for this method, Japanese Patent Application Laid-open Publication No. JP-A-5-291523 has proposed to roughen the capacitor plate surface by use of an ion implantation process.

Now, the prior art process disclosed in JP-A-5-291523 will be described with reference to FIGS. 1A to 1F, which are diagrammatic sectional views for illustrating the prior art process for forming a so called stacked structure capacitor in a semiconductor device.

Referring to FIG. 1A, for a device isolation, a field oxide film 102 having a thickness on the order of 500 nm is selectively formed on a principal surface of a silicon substrate 101 of, for example, P-type, by utilizing a LOCOS (local oxidation of silicon) process. A gate oxide film 103 is formed an the principal surface of the silicon substrate 101, and a patterned gate electrode 104 having a thickness on the order of 300 nm is on format the gate oxide film 103. Then, an insulating film is deposited to cover the whole surface by a known CVD (chemical vapor deposition) process, and an anisotropic dry etching is conducted on the deposited insulating film to form a sidewall 105 which covers each side surface of each gate electrode 104. Furthermore, for example, arsenic ions are implanted using, as a masks each data electrode 104 having each side surface covered with the sidewall 105, and a heat treatment is conducted. Thus, a pair of source/drain diffused regions 106 are formed in a principal surface region of the silicon substrate 101 at opposite sides of each gate electrode 104, respectively, as shown in FIG. 1A.

Referring to FIG. 1B, a first interlayer insulator film 107 having a thickness on the order of 400 nm is formed to cover the whole surface by the CVD process, and a contact hole 108 is formed to penetrate through the interlayer insulator film 107 to reach one source/drain region of each pair of source/drain regions 106, by use of a conventional lithography and a dry etching technology. A polysilicon film 109 having a thickness on the order of 200 nm is deposited by the CVD process to fill the contact hole 108 and to cover the first interlayer insulator film 107. Succeedingly, arsenic is ion-implanted to the polysilicon film 109 with a dose of $5 \times 10^{15}$ ion/cm$^2$ and an accelerating energy of 50 KeV, and a heat treatment is carried out at a temperature of 900° C. in an N$_2$ atmosphere. Thus, a structure as shown in FIG. 1B is obtained.

Thereafter, as shown in FIG. 1C, N$^-$ (nitrogen) ions 110 are implanted into the polysilicon film 109 with a dose of $5 \times 10^{17}$ ion/cm$^2$ and an accelerating energy of 20 KeV, so as to modify the property of a surface of the polysilicon film 109 into a silicon nitride (Si$_x$N$_y$) 111, as shown in FIG. 1C. The silicon nitride 111 is removed by a wet etching using a phosphoric acid (H$_3$PO$_4$) aqueous solution. Thus, the polysilicon film 109 has a roughened surface 109A having convexities and concavities as shown in FIG. 1D.

Then, the polysilicon film 109 having the roughened surface 109A is patterned by use of a conventional lithography and a dry etching technology, so that a capacitor lower plate 112 is formed as shown in FIG. 1E.

A capacitor dielectric film 113 formed of Si$_3$N$_4$ is deposited to cover a surface of the capacitor lower plate 112 by use of a low pressure CVD process, and furthermore, for a capacitor cell plate, a polysilicon film having a thickness on the order of 300 nm is deposited to cover the dielectric film 113 by the CVD process, and phosphorus is doped to the deposited polysilicon film by a thermal diffusion using a source of POCl$_3$. Furthermore, the phosphorus-doped polysilicon film is patterned by use of the lithography and the dry etching technology, so that a capacitor upper plate 114 is formed as shown in FIG. 1F.

Thereafter, a second interlayer insulator film, a contact hole, a bit line and a covering film (all of which are not shown in the drawing) are formed. Thus, a memory cell is completed.

As mentioned above, the prior art process disclosed in JP-A-5-291523 is characterized in that, the N$^+$ ions are implanted into the polysilicon film which will become the capacitor lower plate, to modify the property of the surface of tie polysilicon film into the silicon nitride, and then, the silicon nitride is etch-removed, with the result that the capacitor lower plate has the roughened surface. However, in order to nitride the polysilicon film surface by the N$^+$ ions, the N$^+$ ion implantation requires a high dose of not less than $5 \times 10^{17}$ ion/cm$^2$. However, the ion implantation of such a high dose needs a long time.

For example, assuming to use an existing high-current ion implantation equipment which can process 17 wafers in each batch and to execute the ion implantation with a beam current of 20 mA, about 5 hours are required for each one batch. This greatly lowers the production efficiency of a semiconductor device mass production.

Furthermore, with the surface modification obtained by using the ion beam, a degree of roughness at a boundary between the modified surface layer and an unmodified underlying layer is on the level of atoms. Accordingly, the convexities and concavities of the capacitor lower plate surface obtained by etch-removing the modified surface layer are not so large. As a result, an effective surface area of the modified surface increases to only about 1.2 times at maximum, as compared with the unmodified surface.

Other than the above mentioned method, in order to increase the capacitance of the capacitor, various methods of changing the plate structure have been proposed. For example, a cylinder type and a multi-fin type are known. These structures can substantially increase the capacitance without changing the occupying area, although they have such a disadvantage that the height inevitably becomes high. If these structures are adopted, the cylinder type can increase the capacitance to about 1.9 times, and the multi-fin type can increase the capacitance to about 2 times in case that two fins are provided.

Accordingly, in the stacked structure capacitor manufactured by the prior art method using the ion beam, the rate of increase of capacitance in the stacked structure capacitor is small aid not satisfactory in comparison with the just above mentioned capacitors of the cylinder type and the multi-fin type.

SUMMARY OF THE INVENTION

Accordingly, it is an object of the present invention to provide a method for forming a stacked structure capacitor in a semiconductor device, which has overcome the above mentioned defect of the conventional one.

Another subject of the present invention is to provide a method for forming a stacked structure capacitor in a semiconductor device, capable of roughening a surface of a capacitor lower plate, by use of a simple procedure, and in a shortened time, so as to obtain a highly increased effective surface area.

The above and other objects of the present invention are achieved in accordance with the present invention by a method for forming, in a semiconductor device, a stacked structure capacitor having a lower capacitor plate and an upper capacitor plate sandwiching a dielectric film therebetween, wherein the improvement includes the steps of forming a first conducting film which becomes the lower capacitor plate, implanting ionized clusters to a surface of the first conducting film, selectively remove cluster-implanted regions from the surface of the first conducting film to resultantly roughen the surface of the first conducting film, forming a dielectric film on the roughened surface of the first conducting film, and forming on the dielectric film a second conducting film which becomes the upper capacitor plate.

For example, the ionized clusters are composed of phosphorus. In this case, the cluster-implanted regions can be selectively removed by a wet etching using a phosphoric acid aqueous solution.

Alternatively, the ionized clusters are composed of argon. In this case, the cluster-implanted regions can be selectively removed by oxidizing the cluster-implanted surface of the first conducting film and then carrying a wet etching using a hydrogen fluoride aqueous solution.

The first conducting film can be formed of a polysilicon or platinum. On the other hand, the dielectric film can be formed of silicon nitride, tantalum oxide, strontium titanate, barium strontium titanate, and zirconium lead titanate.

The above and other objects, features and advantages of the present invention will be apparent from the following description of preferred embodiments of the invention with reference to the accompanying drawings.

DESCRIPTION OF THE PREFERRED EMBODIMENTS

Now, a first embodiment of the process in accordance with the present invention for forming a stacked structure capacitor in a semiconductor device, will be described with reference to FIGS. 2A to 2F.

Figure 1A:
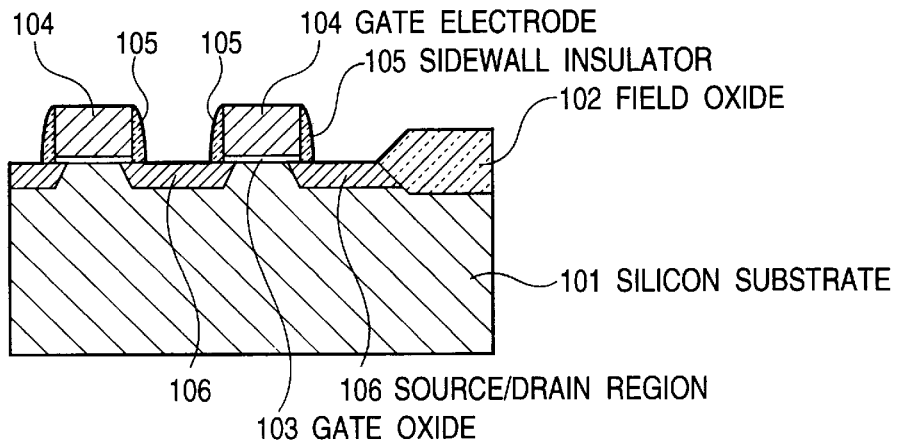
FIGS. 1A to 1F are diagrammatic sectional views of a portion of a semiconductor device, for illustrating the prior art process for forming a stacked structure capacitor in a semiconductor device.
Figure 1B:
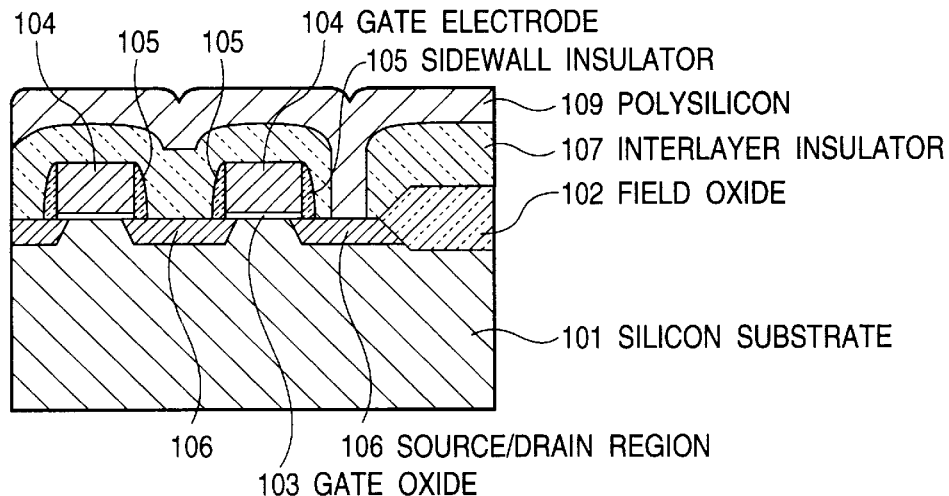
Figure 1C:
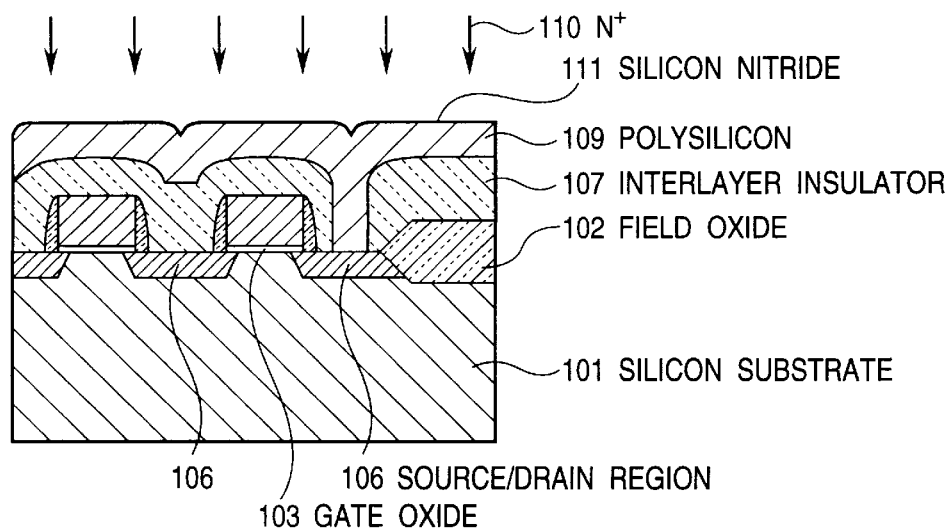
Figure 1D:
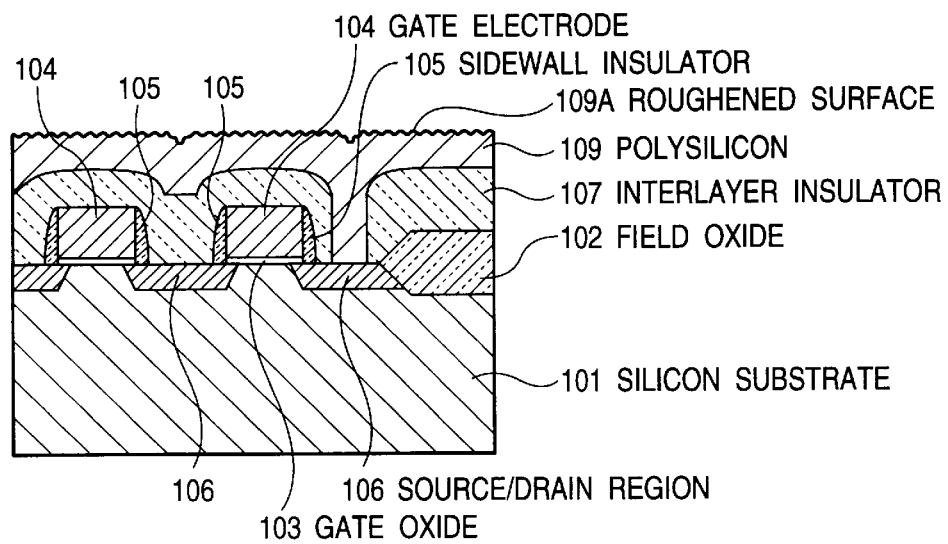
Figure 1E:
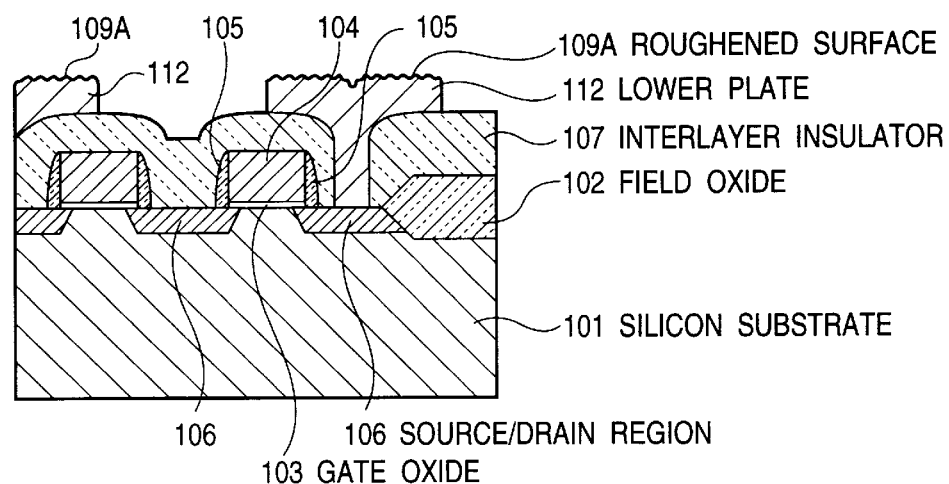
Figure 1F:
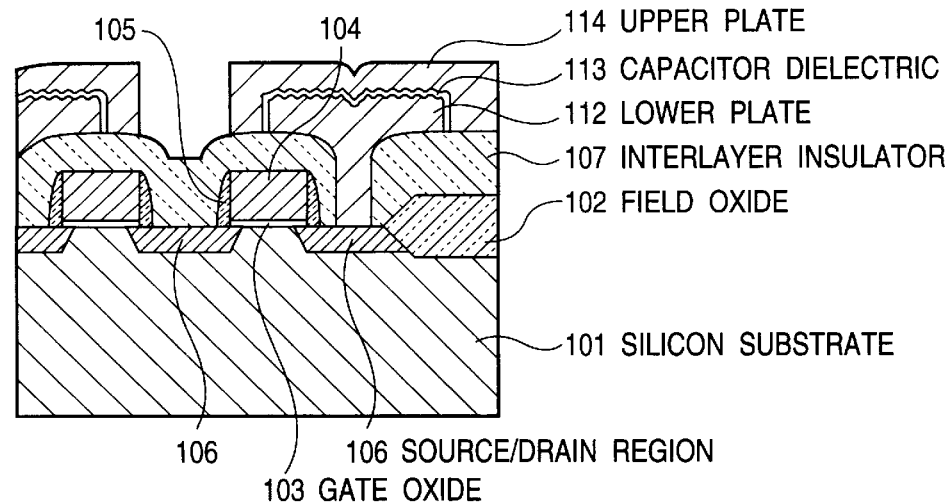
Figure 2A:
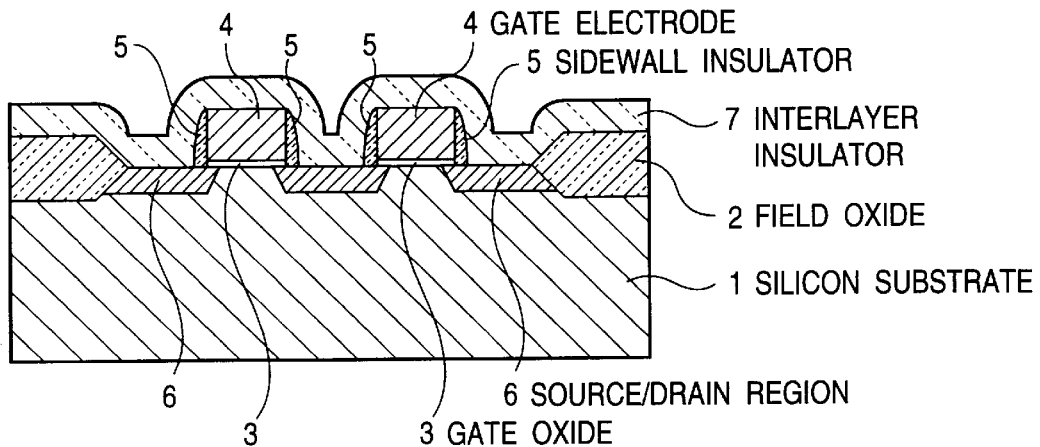
FIGS. 2A to 2F are diagrammatic sectional views of a portion of a semiconductor device, for illustrating a first embodiment of the process in accordance with the present invention for forming a stacked structure capacitor in a semiconductor device.

Referring to FIG. 2A, for a device isolation, a field oxide film 2 having a thickness on the order of 500 nm is selectively formed on a principal surface of a silicon substrate 1 of, for example, P-type, by a LOCOS process. The field oxide film 2 confines a device formation region in which a pair of memory cells are to be formed. A gate oxide film 3 is formed on the principal surface of the silicon substrate 1, and a pair of patterned gate electrode 4 having a thickness on the order of 300 nm are formed, separately from each other, on the gate oxide film 3 within each device formation region.

Then, an insulating film is deposited to cover the whole surface by a known CVD process, and an anisotropic dry etching is performed on the deposited insulating film to form a sidewall 5 which covers each side surface of each gate electrode 4. Furthermore, for example, arsenic ions are implanted using, as a mask, each gate electrode 4 having each side surface covered with the sidewall 5, and a heat treatment is conducted. Thus, a pair of source/drain diffused regions 6 arc formed in a principal surface region of the silicon substrate 1 at opposite sides of each gate electrode 4, respectively, as shown in FIG. 2A.

Figure 2B:
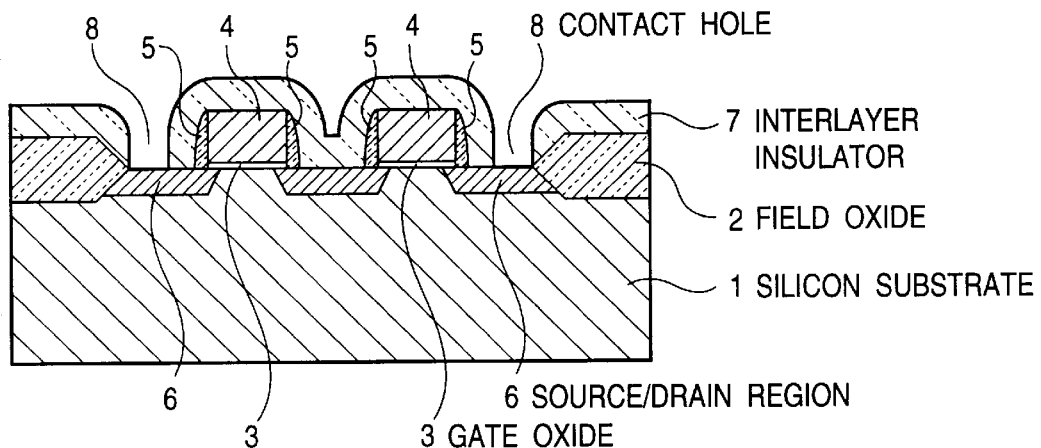
Figure 2C:
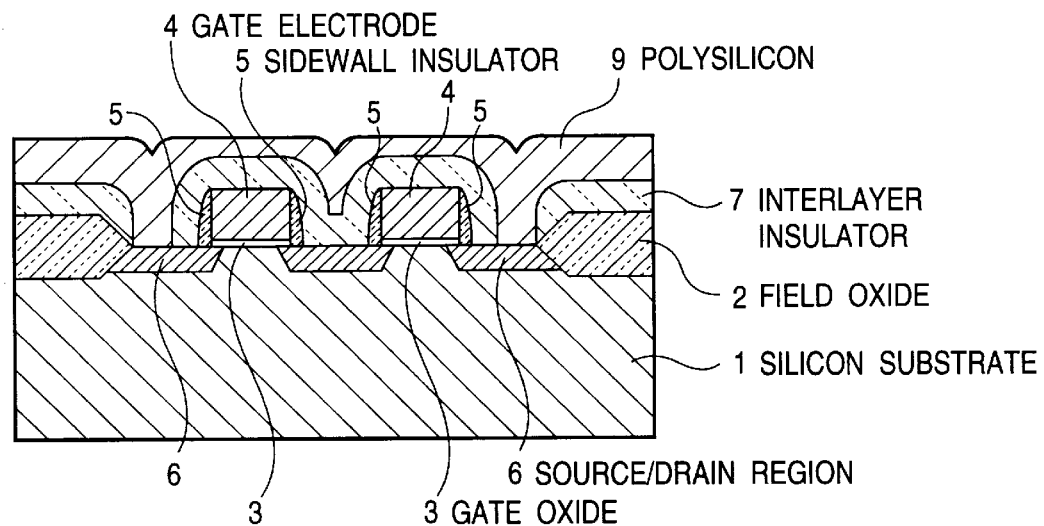

Then, a first interlayer insulator film 7 having a thickness on the order of 400 nm is formed to cover the whole surface by the CVD process, as shown in FIG. 2A. Then, a contact hole 8 is formed to penetrate through each predetermined position of the interlayer insulator film 7 to reach one source/drain region of each pair of source/drain regions 6, by use of a conventional lithography and a dry etching technology, as shown in FIG. 2B, As shown in FIG. 2C, a polysilicon film 9 having a thickness on the order of 200 nm to 400 nm is deposited by a low pressure CVD process to fill the contact hole 8 and to cover the first interlayer insulator film 7.

Succeedingly, phosphorus is doped to the polysilicon film 9 by a thermal diffusion process using a source of $POCl_3$, to cause the polysilicon film 9 to have a phosphorus concentration of $10^{20}$ atom/cm$^3$. Furthermore, the doped polysilicon film 9 is patterned into a rectangular shape by use of the lithography, so that a capacitor lower plate 10 is formed as shown in FIG. 2D.

Figure 2D:
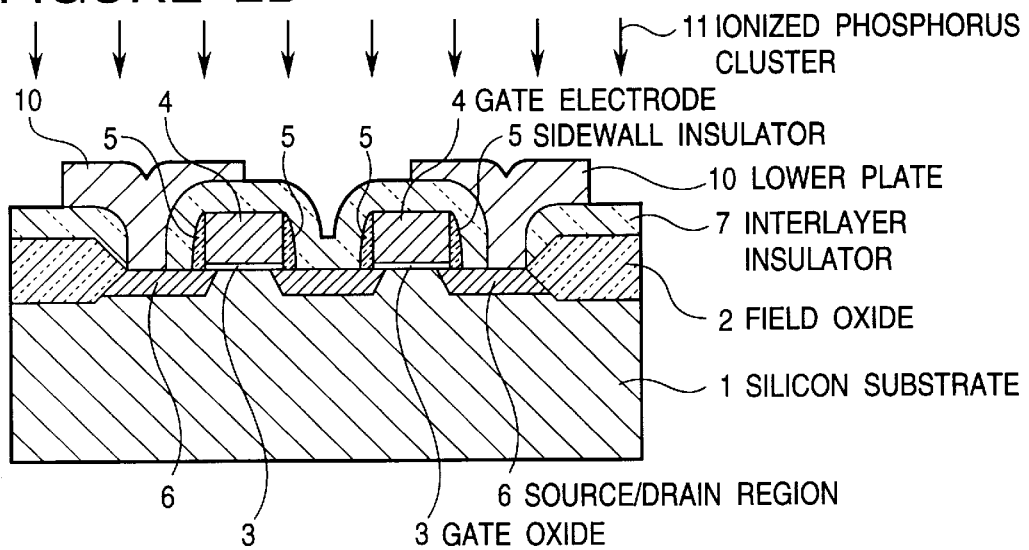

Then, as shown in FIG. 2D, a plurality of ionized phosphorus clusters 11 are implanted or impacted to an upper surface of the capacitor lower plate 10 of the doped polysilicon film. Here, the accelerating energy for the implantation is on the order of 20 KeV, and a phosphorus cluster composed of about 100 phosphorus atoms is ionized by one elementary charge (an electric charge corresponding to one ionized monovalent element). The dose is on the order of $1 \times 10^{11}$ to $1 \times 10^{12}$ ion/cm$^2$ (namely, $1 \times 10^{11}$ to $1 \times 10^{12}$ cluster/cm$^2$).

Figure 2E:
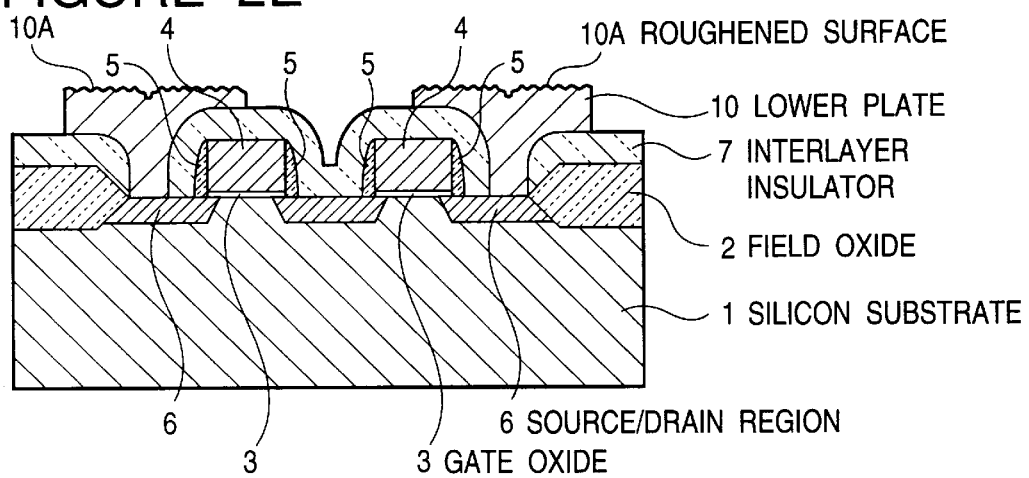

After the cluster implantation is completed, a wet etching is performed to roughen the surface of the capacitor lower plate 10, so that the surface of the capacitor lower plate 10 becomes concave and convex as shown in FIG. 2E. This wet etching is performed by immersing the wafer in a phosphoric acid aqueous solution heated at a temperature of 140° C. to 170° C., for a period of time of about 60 to 90 minutes. With this wet etching, portions damaged by the ionized cluster implantation and having a locally high concentration of phosphorus impurity, are selectively etched, with the result that convexities and concavities are formed on the surface of the capacitor lower plate 10.

Incidentally, in this embodiment, the phosphoric acid aqueous solution is used as the etching liquid, but the etching liquid is in no way limited to the phosphoric acid aqueous solution and it is possible to use any etching liquid which can selectively etch-remove the cluster-implanted parts. For example, the cluster-implanted parts can be removed by a mixed aqueous solution containing hydrogen fluoride, nitric acid and glacial acetic acid. Alternatively in place of using the etching liquid, it is also possible to selectively remove die cluster-implanted parts by exposing the cluster-implanted surface of the polysilicon film to a plasma containing $CF_4$ and $O_2$, or a plasma containing $SF_6$.

Also incidentally, in the shown embodiment, after the polysilicon film is deposited, the polysilicon film is patterned into a rectangular shape by the lithography, to complete the patterned lower plate 10, and thereafter, the ionized phosphorus clusters 11 are implanted to the lower plate 10. However, the order of these steps is not limited. For example, the order of these steps can be so modified that after the polysilicon film is deposited, the ionized phosphorus clusters 11 are implanted to the polysilicon film, and then, the cluster-implanted parts are etch-removed to form convexities and concavities on the surface of the polysilicon film, and thereafter, the polysilicon film is patterned into a rectangular shape by the lithography, to complete the patterned lower plate 10 having the convexities and concavities on the surface thereof.

Figure 2F:
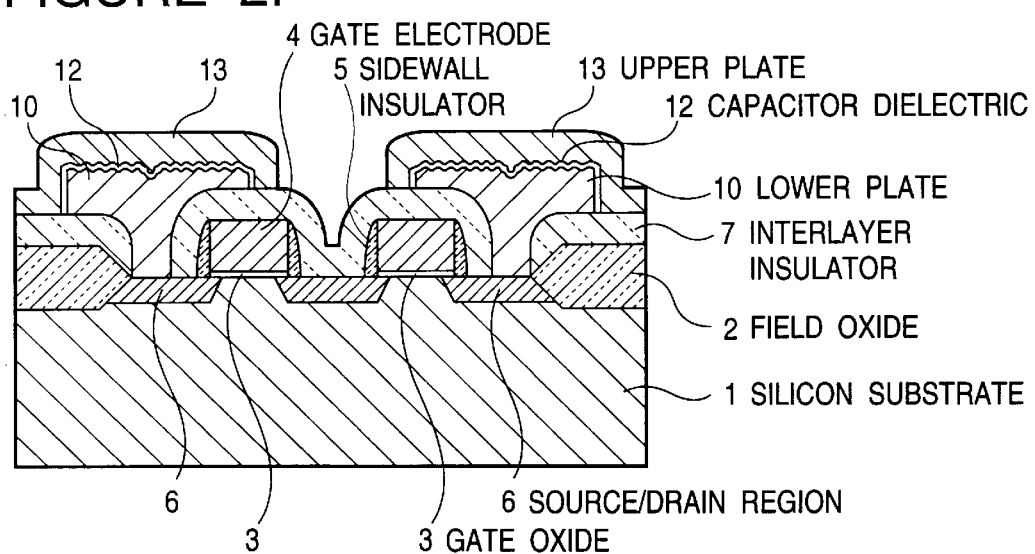

After the patterned lower plate 10 having the convexities and concavities on the surface thereof is formed as mentioned above, a capacitor dielectric film 12 having a thickness of 5 nm to 10 nm is deposited to cover the whole surface, by use of a low pressure CVD process using a gas composed of $NH_3$ and $SiH_2Cl_2$. Furthermore, a polysilicon (which becomes a capacitor upper plate 13) film having a thickness of 200 nm to 300 nm is deposited on the capacitor dielectric film 12 by use of the low pressure CVD process. Similarly to the lower plate, phosphorus is doped to the polysilicon film by a thermal diffusion process using a source of $POCl_3$, to cause the polysilicon film to have a phosphorus concentration of $10^{20}$ atom/cm$^3$, and furthermore, the doped polysilicon film is patterned by use of a lithography and a dry etching, so that the capacitor upper plate 13 is formed as shown in FIG. 2F.

Thus, a stacked structure capacitor composed of the lower plate 10 electrically connected to the source/drain region 6, the capacitor dielectric film 12 and the upper plate 13 is formed on the silicon substrate. In the capacitor thus formed, the shape and the degree of the convexities and concavities on the surface of the lower plate 10 can be controlled by adjusting various parameters such as the number of atoms constituting one ionized cluster, the accelerating energy for implantation, and the dose.

Thereafter, a second interlayer insulator film, a contact hole, a bit line and a covering film (all of which are not shown in the drawing) are formed. Thus, a memory cell is completed.

As seen from the above, the first embodiment is characterized in that, after the ionized phosphorus clusters are implanted to the surface of the polysilicon film, the cluster-implanted parts are etch-removed to form convexities and concavities on the surface of the polysilicon film, namely, to roughen the surface of the polysilicon film. This method is intended to form convexities and concavities on the surface by positively utilizing a difference in an etching rate caused by introducing physical implantation defects and an impurity concentration difference.

Now, how the above mentioned convexities and concavities can be formed, will be explained with reference to FIGS. 3A to 3C.

The cluster is an aggregation of a few to a few thousand atoms or molecules, and therefore, the ionized cluster is an ionized aggregation of atoms or molecules. Concerning the ionized cluster, recently, various research reports have been made. Here, explanation will be made on the case that an ionized cluster is implanted into a surface of a polysilicon film which constitutes a capacitor lower plate.

Figure 3A:
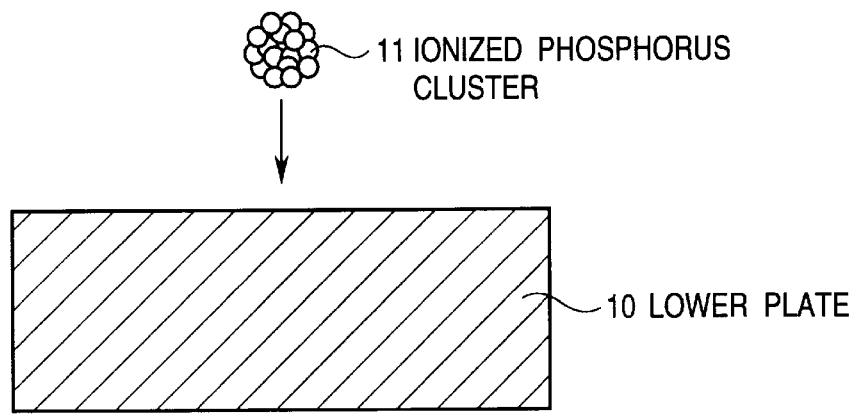
FIGS. 3A to 3C are diagrammatic sectional views of a capacitor lower plate, for illustrating a first process for roughening the capacitor lower plate, which is used in the process shown in FIGS. 2A to 2F.
Figure 3B:
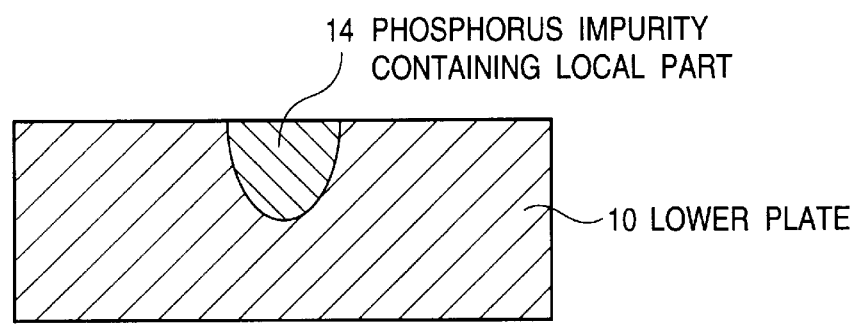
Figure 3C:
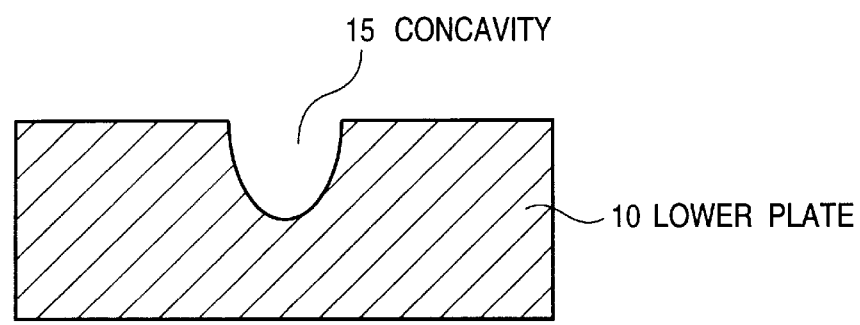

As shown in FIG. 3A, an ionized phosphorus cluster 11 composed of 100 phosphorus atoms and accelerated with the accelerating energy of 20 KeV is implanted or impacted to an upper surface of a capacitor lower plate 10 composed of a polysilicon film. Since this ionized phosphorus cluster 11 has a very large mass number, the ionized phosphorus cluster 11 can reach only a very shallow depth in the capacitor lower plate 10. Therefore, a phosphorus cluster impacted, namely, damaged local region 14, which is extremely larger in size than one phosphorus atom, is formed in the surface of the capacitor lower plate 10 as shown in FIG. 3B. In addition, in this phosphorus cluster impacted local region 14 formed in the surface of the capacitor lower plate 10, the phosphorus impurity concentration becomes locally extremely high. In the local region 14, furthermore, crystal defects occur and the region becomes an amorphous condition because of the damage caused by the cluster impacting.

Thereafter, a wet etching is performed by immersing the lower plate 10 in a phosphoric acid aqueous solution heated at a temperature of 140° C. to 170° C., for a period of time of about 60 to 90 minutes. The heated phosphoric acid aqueous solution has an etching rate depending upon the impurity concentration and a characteristics of selectively etching a portion having a high impurity concentration. Therefore, only the phosphorus cluster impacted local region 14 is selectively etched, so that a concavity or crater 15 is formed as shown in FIG. 3C.

Accordingly, if a number of ionized phosphorus clusters or craters are impacted to the surface of the lower plate 10, a number of concavities are formed for the surface of the lower plate 10, so that the surface of the lower plate 10 becomes concave and convex, namely, roughened.

Now, a second embodiment of the process in accordance with the present invention for forming a stacked structure capacitor in a semiconductor device, will be described with reference to FIGS. 2A to 2D. This second embodiment is completely the same as the first embodiment in the steps shown in FIGS. 2A to 2C just before the ionized phosphorus clusters are implanted in the first embodiment. Therefore, in FIGS. 2A to 2D, elements corresponding to those shown in FIGS. 2A to 2F are given the same Reference Numerals, and explanation thereof will be omitted for simplification of description.

Figure 4A:
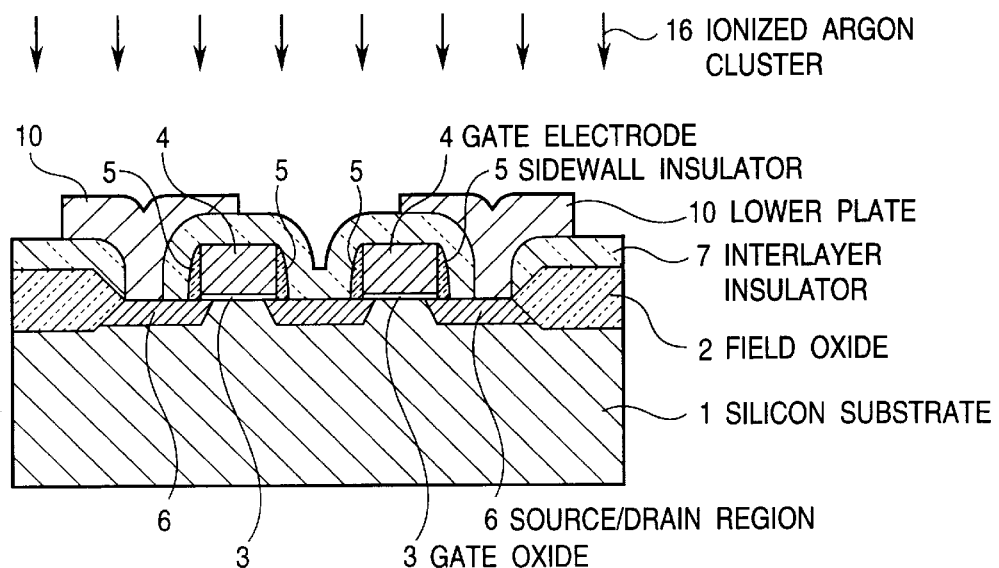
FIGS. 4A to 4D are diagrammatic sectional views of a portion of a semiconductor device, for illustrating a second embodiment of the process in accordance with the present invention for forming a stacked structure capacitor in a semiconductor device.

In place of implanting the ionized phosphorus clusters, in the second embodiment, as shown in FIG. 4A, ionized argon clusters 16 are implanted or impacted to an upper surface of the capacitor lower plate 10 of the polysilicon film. Here, the accelerating energy for the implantation is on the order of 20 KeV, and the argon cluster composed of about 200 argon atoms is ionized by one elementary charge. The dose is on the order of $1 \times 10^{11}$ ion/cm$^2$ (namely, $1 \times 10^{11}$ cluster/cm$^2$).

Figure 4B:
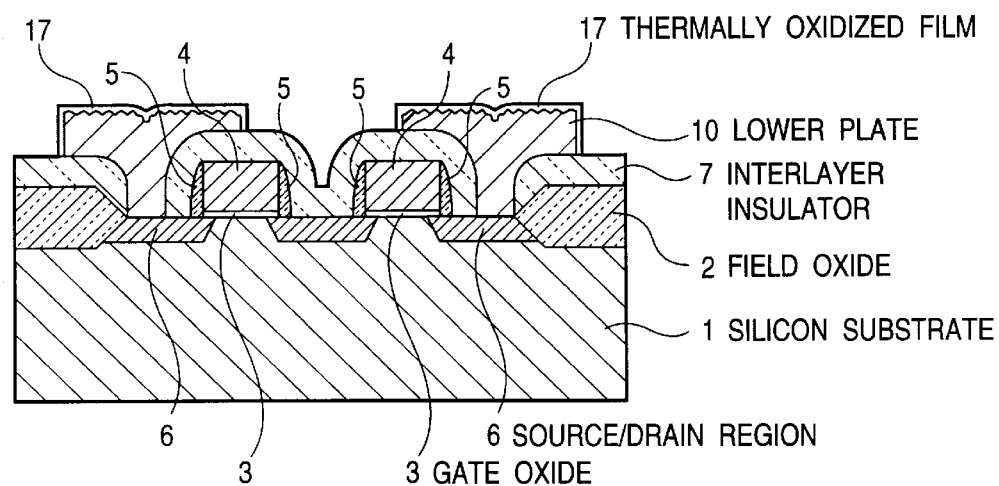

After the cluster implantation is completed, the surface of the capacitor lower plate 10 of the polysilicon film is thermally oxidized in an oxidizing atmosphere at a temperature of 750° C., so that a thermally oxidized film 17 having a thickness of about 10 nm is formed to cover the surface of the capacitor lower plate 10, as shown in FIG. 4B. In this process, the oxidizing rate becomes large only in surface regions damaged by the ionized argon clusters, and therefore, the thermally oxidized film 17 formed on the damaged surface regions has a thickness larger than that of the thermally oxidized film 17 formed on undamaged surface regions. As a result, a boundary between the thermally oxidized film 17 and the polysilicon film of the underlying lower plate 10 becomes concave and convex in shape, as shown in FIG. 4B.

Figure 4C:
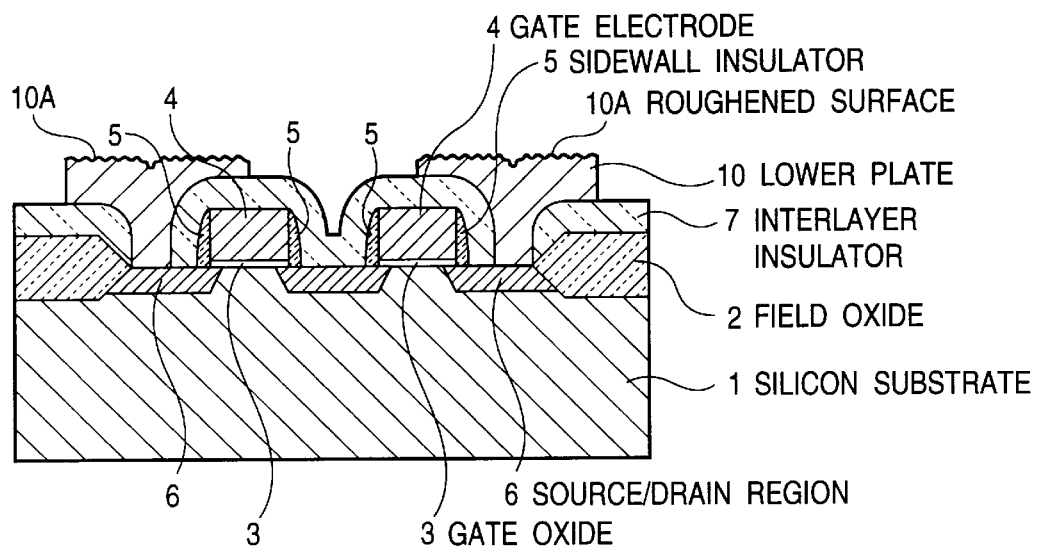

Thereafter, the wafer is immersed in a dilute hydrofluoric acid aqueous solution for five minutes, so that the thermally oxidized film 17 is removed as shown in FIG. 4C. Thus, as shown in FIG. 4C, the capacitor lower plate 10 having a convex-concave surface is formed.

Incidentally, in the shown second embodiment, after the polysilicon film is deposited, the polysilicon film-n is patterned into a rectangular shape by the lithography, to complete the patterned lower plate, and thereafter, the ionized argon clusters are implanted to the lower plate. However, similarly to the first embodiment, the order of these steps is not limited. For example, the order of these steps can be so modified that after the polysilicon film is deposited, the ionized argon clusters are implanted to the polysilicon film, and then, the thermal oxidation and the etching removal using the dilute hydrofluoric acid aqueous solution are performed to form convexities and concavities on the surface of the polysilicon film, and thereafter, the polysilicon film is patterned into a rectangular shape by the lithography, to complete the patterned lower plate 10 having the convexities and concavities on the surface thereof.

Figure 4D:
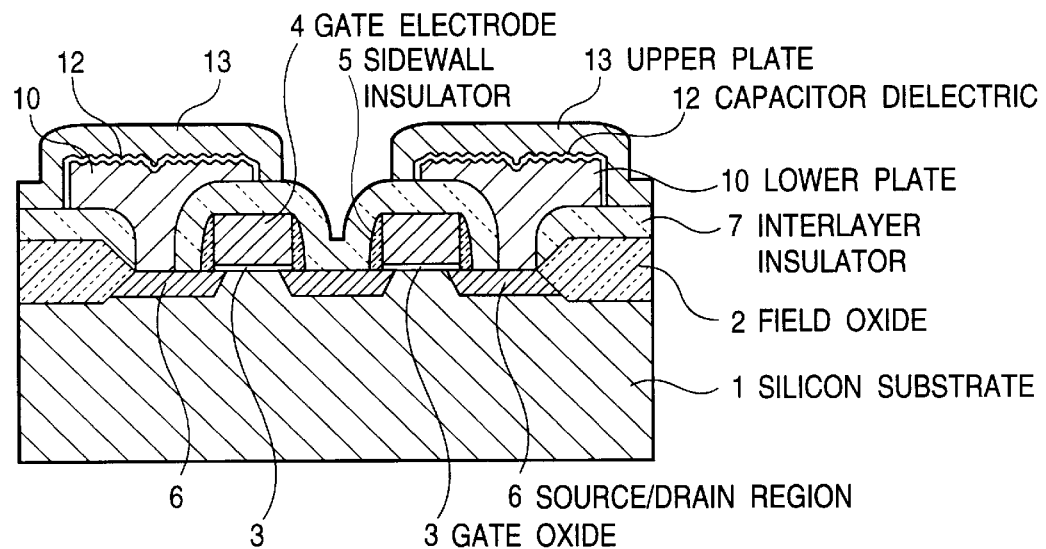

After the patterned lower plate 10 having the convexities and concavities on the surface thereof is formed as mentioned above, a process similar to the first embodiment will be performed. Namely, a capacitor dielectric film 12 having a thickness of 5 nm is deposited to cover the whole surfaces by use of a low pressure CVD process using a gas composed of NH$_3$ and SiH$_2$Cl$_2$. Furthermore, a polysilicon (which becomes a capacitor upper plate 13) film having a thickness of 200 nm is deposited on the capacitor dielectric film 12 by use of the low pressure CVD process. Similarly to the lower plate, phosphorus is doped to the polysilicon film by a thermal diffusion process using a source of POCl$_3$, to cause the polysilicon film to have a phosphorus concentration of $10^{19}$ atom/cm$^3$, and furthermore, the doped polysilicon film is patterned by use of a lithography and a dry etching, so that the capacitor upper plate 13 is formed as shown in FIG. 4D.

Thus, a stacked structure capacitor composed of the lower plate 10 electrically connected to the source/drain region 6, the capacitor dielectric film 12 and the upper plate 13 is formed on the silicon substrate. Thereafter, similarly to the first embodiment, a second interlayer insulator film, a contact hole, a bit line and a covering film (all of which are not shown in the drawing) are formed. Thus, a memory cell is completed.

Now, how to roughen the surface of the lower plate in the second embodiment will be explained with reference to FIGS. 5A to 5D.

The second embodiment is characterized by impacting the ionized argon clusters to the lower plate surface to form damaged local regions, and then, performing a thermal oxidation.

Figure 5A:
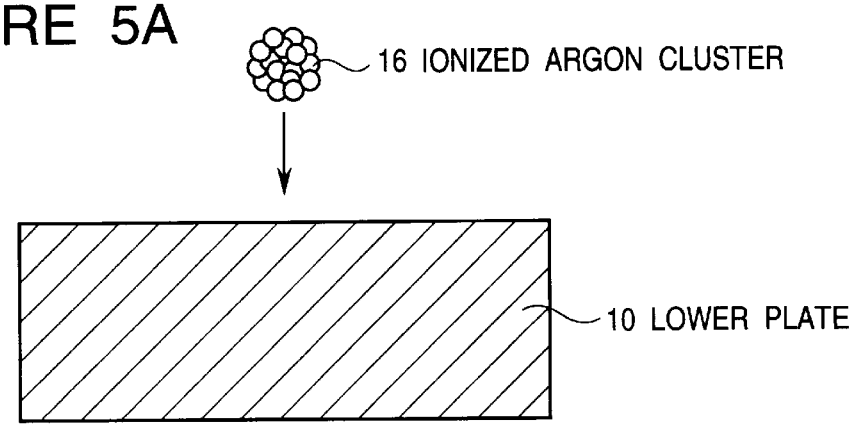
FIGS. 5A to 5D are diagrammatic sectional views of a capacitor lower plate, for illustrating a second process for roughening the capacitor lower plate, which is used in the process shown in FIGS. 4A to 4D.
Figure 5B:
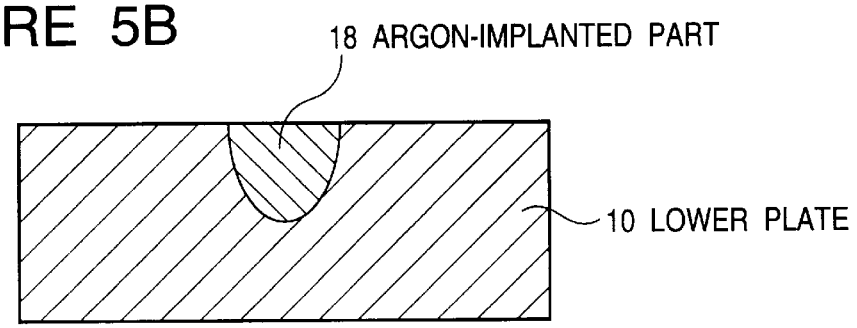

Similarly to the first embodiment, an ionized argon cluster 16 composed of 200 argon atoms and accelerated with the accelerating energy of 20 KeV is implanted or impacted to an upper surface of a capacitor lower plate 10 composed of a polysilicon film, as shown in FIG. 5A. As a result, in an argon cluster impacted local region 18 on the surface of die capacitor lower plate 10 as shown in FIG. 5B, crystal defects occur and the region becomes an amorphous condition because of a damage caused by the cluster impacting.

Figure 5C:
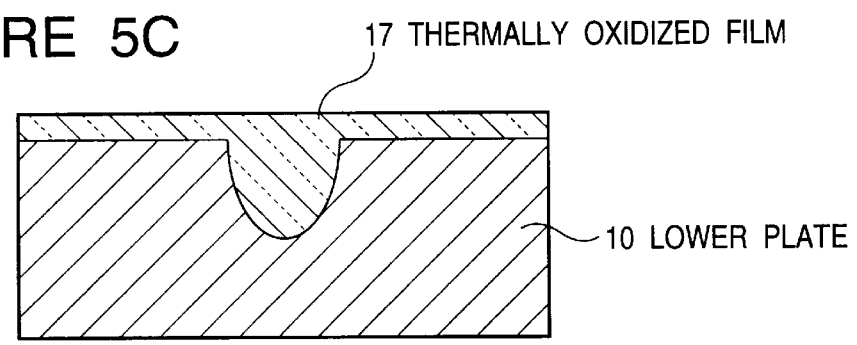

Thereafter, the lower plate 10 of the polysilicon film is thermally oxidized in an oxidizing atmosphere to form the thermally oxidized film 17. As mentioned above, since the damaged local region, namely, the argon cluster impacted local region 18 have a large oxidizing rate, the thermally oxidized film 17 is formed to match with a shape of the boundary between the lower plate 10 of the polysilicon film and the argon cluster impacted local region 18. Namely, as shown in FIG. 5C, the thermally oxidized film 17 has a downward projection or convexity having substantially the same shape of the cluster impacted local region 18.

Figure 5D:
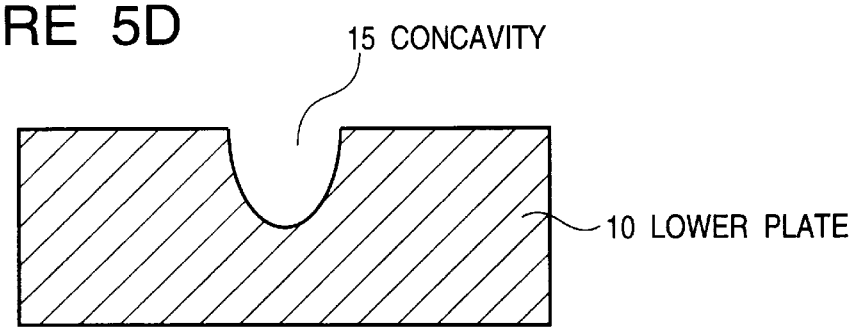

Thereafter, the oxide film is etch-removed by a hydrofluoric acid so that a concavity or crater 15 is formed on the surface of the lower plate 10 as shown in FIG. 5D.

Accordingly, in the second embodiment, the surface of the lower plate 10 becomes concave and convex, namely, roughened, similarly to the first embodiment.

In the above mentioned embodiments, the capacitor dielectric firm is formed of silicon nitride, but can be formed of a metal oxide such as tantalum oxide, strontium titanate, barium strontium titanate, and zirconium lead titanate. Furthermore, the lower plate is in no way limited to polysilicon and can be formed of for example platinum. If the lower plate is formed of platinum, it is most effective to form the capacitor dielectric film of barium strontium titanate.

As seen from the above, the method in accordance with the present invention is characterized in that after ionized clusters are impacted or implanted to a surface of a conducting film which becomes a capacitor lower plate, clusters implanted local regions of the surface of the conducting film are selectively etch-removed, with the result that the surface of the conducting film is roughened to have an increased effective surface area. Here, the cluster is preferred to be an aggregation of not less than 10 atoms, more preferably, not less than 100 atoms. The larger the number of atoms constituting the cluster is, the dose required to form a desired concave-convex surface, namely, a highly increased effective surface area, becomes small, with the result that the time required for the ion implantation can be correspondingly shortened.

Thus, the method in accordance with the present invention have the following advantages:

It is sufficient if the dose of ionized cluster implantation is not greater than $10^{13}$ ion/cm$^2$. Therefore, it is possible to remarkably shorten the time required for the ion implantation in the manufacturing process. For example, the prior art example shown in FIGS. 1A to 1F required about five hours, but in the method in accordance with the present invention, the required time is shortened to about ten minutes.

Since the depth of implantation of the ionized clusters corresponds the concavity and convexity formed on the lower plate surface, the increase of the surface area obtained by the roughening processing is larger than the prior art example shown in FIGS. 1A to 1F. As mentioned hereinbefore, in the prior art example shown in FIGS. 1A to 1F roughening the surface by use of the ion beam, the increase of the surface area was limited to about 1.2 times at maximum as compared with the not-roughened surface. In the present invention, on the other hand, the surface area can be increased to 1.8 times at maximum. This value means that, by using the ionized cluster beam, the present invention can realize the capacitance of the capacitor comparable to that of the cylinder type capacitor and the multi-fin type capacitor.

Thus, a capacitor having a large capacitance can simply be formed without increasing the memory cell size, and without a drop of reliability caused by thinning the capacitor dielectric film.

The invention has thus been shown and described with reference to the specific embodiments. However, it should be noted that the present invention is in no way limited to the details of the illustrated structures but changes and modifications may be made within the scope of the appended claims.

What is claimed is:

1. A method for forming a stacked structure capacitor having a dielectric film sandwiched between a lower capacitor plate and an upper capacitor plate, comprising the steps of:
    forming a first conducting film to serve as said lower capacitor plate,
    implanting a plurality of ionized clusters on a surface of said first conducting film, so as to form a plurality of cluster implanted regions, wherein each of said plurality of ionized clusters comprises at least 10 atoms,
    selectively removing said cluster-implanted regions from said surface of said first conducting film so as to roughen said surface of said first conducting film,
    forming a dielectric film on said roughened surface of said first conducting film, and
    forming, on said dielectric film, a second conducting film to serve as said upper capacitor plate.

2. A method claimed in claim 1 wherein
    said plurality of ionized clusters are composed of phosphorus, and
    said cluster-implanted regions are selectively removed by a wet etching using a phosphoric acid aqueous solution.

3. A method for forming, in a semiconductor device, a stacked structure capacitor having a dielectric film sandwiched between a lower capacitor plate and an upper capacitor plate, comprising the steps of:
    forming a first conducting film that will operate as said lower capacitor plate,
    implanting a plurality of ionized clusters on a surface of said first conducting film, so as to form a plurality of cluster implanted regions,
    selectively removing said cluster-implanted regions from said surface of said first conducting film so as to roughen said surface of said first conducting film,
    forming a dielectric film on said roughened surface of said first conducting film, and
    forming, on said dielectric film, a second conducting film that will operate as said upper capacitor plate, and wherein
    said plurality of ionized clusters are composed of argon, and
    said cluster-implanted regions are selectively removed by oxidizing said surface of said first conducting film, and then carrying a wet etching using a hydrogen fluoride aqueous solution.

4. A method claimed in claim 3 wherein
    said oxidation is performed by a thermal oxidation technique.

5. A method claimed in claim 1 wherein said first conducting film is formed of a material selected from the group consisting of polysilicon and platinum.

6. A method claimed in claim 1 wherein said dielectric film can be formed of a material selected from the group consisting of silicon nitride, tantalum oxide, strontium titanate, barium strontium titanate, and zirconium lead titanate.

7. A method claimed in claim 1 wherein each of said plurality of ionized clusters is comprised of at least 100 atoms.

8. A method claimed in claim 7 wherein
    said first conducting film is formed of a phosphorus-doped polysilicon, and
    said plurality of ionized clusters are composed of phosphorus, and
    said cluster-implanted regions are selectively removed by a wet etching using a phosphoric acid aqueous solution.

9. A method for forming, in a semiconductor device, a stacked structure capacitor having a dielectric film sandwiched between a lower capacitor plate and an upper capacitor plate, comprising the steps of:
    forming a first conducting film that will operate as said lower capacitor plate,
    implanting a plurality of ionized clusters on a surface of said first conducting film, so as to form a plurality of cluster implanted regions,
    selectively removing said cluster-implanted regions from said surface of said first conducting film so as to roughen said surface of said first conducting film,
    forming a dielectric film on said roughened surface of said first conducting film, and
    forming, on said dielectric film, a second conducting film that will operate as said upper capacitor plate, wherein
    each of said ionized clusters is comprised of at least 100 atoms, and wherein
    said first conducting film is formed of a phosphorus-doped polysilicon, and
    said ionized clusters are composed of argon, and
    said cluster-implanted regions are selectively removed by oxidizing said cluster-implanted surface of said first conducting film and then carrying a wet etching using a hydrogen fluoride aqueous solution.

10. A method as recited in claim 1, wherein
said plurality of ionized clusters are comprised of phosphorus.

11. A method as recited in claim 10, wherein
each of said clusters comprise an aggregation of about 100 atoms.

12. A method as recited in claim 1, wherein
said plurality of ionized clusters are comprised of argon.

13. A method as recited in claim 12, wherein
each of said clusters comprise an aggregation of about 200 atoms.

14. A method as recited in claim 1, wherein
said forming of said roughened surface of said first conducting film is effected so as to provide a roughened surface that comprises a roughened surface area that is at least 1.2 times greater than a respectively un-roughened surface area.

15. A method as recited in claim 1, wherein
said forming of said roughened surface of said first conducting film is effected so as to provide a roughened surface that comprises a roughened surface area that is about 1.8 times greater than a respectively un-roughened surface area.

16. A method as recited in claim 1, wherein
said cluster-implanted regions are selectively removed from said surface of said first conducting film.

17. A method as recited in claim 16, wherein
said plurality of ionized clusters are composed of argon, and said cluster-implanted regions are selectively removed by oxidizing said surface of said first conducting film, and then carrying a wet etching using a hydrogen fluoride aqueous solution.

18. A method as recited in claim 16, wherein
said plurality of ionized clusters are composed of argon, and said cluster-implanted regions are selectively removed by exposing said surface of said first conducting film to a plasma.

19. A method as recited in claim 18, wherein
said plasma is comprised of one of $CF_4$ and $SF_6$.

20. A method as recited in claim 3, wherein
each of said clusters comprise an aggregation of at least 10 atoms.

21. A method as recited in claim 3, wherein
each of said clusters comprise an aggregation of at least 100 atoms.

22. A method as recited in claim 3, wherein
each of said clusters comprise an aggregation of about 200 atoms.

23. A method as recited in claim 4, wherein
said forming of said roughened surface of said first conducting film is effected so as to provide a roughened surface that comprises a roughened surface area that is at least 1.2 times greater than a respectively un-roughened surface area.

24. A method as recited in claim 9, wherein
said forming of said roughened surface of said first conducting film is effected so as to provide a roughened surface that comprises a roughened surface area that is at least 1.2 times greater than a respectively un-roughened surface area.

25. A method as recited in claim 9, wherein
each of said clusters comprise an aggregation of about 200 atoms.

* * * * *